(12) United States Patent
Sautter et al.

(10) Patent No.: US 12,540,965 B2
(45) Date of Patent: Feb. 3, 2026

(54) SEMICONDUCTOR SWITCH ASSEMBLY HAVING A MONITORING FUNCTION, ENERGY SYSTEM AND VEHICLE

(71) Applicant: Robert Bosch GmbH, Stuttgart (DE)

(72) Inventors: Siegbert Sautter, Stuttgart (DE); Patrick Kaupp, Stuttgart (DE); Johannes Swoboda, Stuttgart (DE); Peter Kohn, Stuttgart (DE); Sebastian Rueck, Tamm (DE); Thomas Schaedlich, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 164 days.

(21) Appl. No.: 18/558,878

(22) PCT Filed: Apr. 25, 2022

(86) PCT No.: PCT/EP2022/060805
§ 371 (c)(1),
(2) Date: Nov. 3, 2023

(87) PCT Pub. No.: WO2022/238094
PCT Pub. Date: Nov. 17, 2022

(65) Prior Publication Data
US 2024/0241170 A1    Jul. 18, 2024

(30) Foreign Application Priority Data
May 11, 2021  (DE) ............. 10 2021 204 766.1

(51) Int. Cl.
*G01R 31/26*   (2020.01)
*G01R 31/27*   (2006.01)
*H03K 17/081*  (2006.01)

(52) U.S. Cl.
CPC ......... *G01R 31/2621* (2013.01); *G01R 31/27* (2013.01); *H03K 17/08104* (2013.01)

(58) Field of Classification Search
CPC .... G01R 31/26; G01R 31/2621; G01R 31/27; G01R 31/28; G01R 31/2812;
(Continued)

(56) References Cited

U.S. PATENT DOCUMENTS

2012/0161681 A1   6/2012  Kuroda
2015/0316617 A1  11/2015  Shiraishi et al.
2018/0238935 A1   8/2018  Nakashima et al.

FOREIGN PATENT DOCUMENTS

DE   202016006083 U1   1/2018
DE   102005061215 B4   6/2019
WO     2020216486 A1  10/2020

OTHER PUBLICATIONS

Translation of International Search Report for Application No. PCT/EP2022/060805 dated Jul. 20, 2022 (2 pages).

*Primary Examiner* — Son T Le
(74) *Attorney, Agent, or Firm* — Michael Best & Friedrich LLP

(57) ABSTRACT

The invention relates to a semiconductor switch assembly, an energy system, and a vehicle. The semiconductor switch assembly includes a first semiconductor switch (S11), a second semiconductor switch (S12), a resistor (10), an input terminal (20), an output terminal (22), a reference potential terminal (24), and an analysis unit (30), the first semiconductor switch (S11) and the second semiconductor switch (S12) being connected in series between the input terminal (20) and the output terminal (22) and being designed to allow and prevent a current to flow between the input terminal (20) and the output terminal (22) on the basis of a triggering operation by the analysis unit (30). The resistor (10) is connected between the reference potential terminal (24) and a connection point (50) between the first semiconductor switch (S11) and the second semiconductor switch (S12). The analysis unit (30) is configured to determine, in (Continued)

the switched-off state of both semiconductor switches, a short circuit in the first semiconductor switch (S11) when an input voltage (UE) between the input terminal (20) and the reference potential terminal (24) corresponds to a voltage drop (U10) over the resistor (10), and a short circuit in the second semiconductor switch (S12) when an output voltage (UA) between the output terminal (22) and the reference potential terminal (24) corresponds to a voltage drop (U10) over the resistor (10).

9 Claims, 2 Drawing Sheets

(58) Field of Classification Search
CPC .. G01R 31/327; G01R 31/3277; G01R 31/50; H03K 17/081; H03K 17/08104; H03K 17/687; H03K 17/6874; H03K 2217/0009; H03K 17/12; H03K 17/122
See application file for complete search history.

SEMICONDUCTOR SWITCH ASSEMBLY HAVING A MONITORING FUNCTION, ENERGY SYSTEM AND VEHICLE

BACKGROUND OF THE INVENTION

The present invention relates to a semiconductor switch assembly having a monitoring function, an energy system having such a semiconductor switch assembly, and a vehicle having such an energy system.

Known from the prior art are energy systems such as electric drive systems for electrically driven vehicles are known, e.g., comprising a traction battery and an electric drive motor. Electromechanical contactors are, e.g., used to electrically connect and disconnect the traction battery from the drive motor, which are monitored for fault states such as bonding and/or welding of electrical contacts by means of a diagnostic functionality. Such diagnostic functionalities are, e.g., used when opening the contactors. Accordingly, if a fault state is detected, then it is possible to protect the electrical energy system by means of a suitable fault response.

It is also known to use MOSFETs in what is referred to as a "back-to-back" arrangement in place of contactors to connect and disconnect electrical energy sources and electrical consumers.

US 2018/0238935 A1 describes a diagnostic device designed to diagnose deviations of a power supply input circuit and the like.

US 2015/0316617 A1 describes a fault detection device designed to detect switching errors of at least one electronic switch, which can be used to disconnect a battery pack from an electrical consumer as a function of a present fault state.

SUMMARY OF THE INVENTION

Proposed according to a first aspect of the present invention is a semiconductor switch assembly having a monitoring function and including a first semiconductor switch, a second semiconductor switch, a resistor, an input terminal, an output terminal, a reference potential terminal, and an analysis unit. The first semiconductor switch and the second semiconductor switch preferably comprise an inverse diode (also referred to as a body diode) and are, e.g., designed as MOSFETs, in particular as SiC MOSFETs, and more in particular as identical semiconductor switches. The reference potential terminal is, e.g., a ground terminal of the semiconductor switch assembly. The analysis unit is, e.g., designed as an ASIC, FPGA, processor, digital signal processor, microcontroller, or the like.

The first semiconductor switch and the second semiconductor switch are connected in series between the input terminal and the output terminal such that a drain terminal of the first semiconductor switch is connected to the input terminal, a drain terminal of the second semiconductor switch is connected to the output terminal, and a source terminal of the first semiconductor switch is connected to a source terminal of the second semiconductor switch at a connection point for the two semiconductor switches. Such an opposing arrangement of the semiconductor switches is also referred to as a "back-to-back" arrangement. The two semiconductor switches are designed to allow and prevent a current to flow between the input terminal and the output terminal on the basis of a triggering operation through the analysis unit.

The resistance is connected between the reference potential terminal and the connection point of the first semiconductor switch and the second semiconductor switch.

The analysis unit is designed to determine, in a state in which the first semiconductor switch and the second semiconductor switch are open, a short circuit in the first semiconductor switch when an input voltage between the input terminal and the reference potential terminal substantially corresponds to a voltage drop over the resistance (i.e., a common-source voltage), and to determine a short circuit in the second semiconductor switch when an output voltage between the output terminal and the reference potential terminal substantially corresponds to a voltage drop over the resistor. The term "substantially" is in this context understood to mean compliance with a predefined maximum permissible deviation of respective voltage values from each other, which results from, e.g., measurement inaccuracies when measuring the respective voltages and/or from connections between the source and drain terminals of the semiconductor switches that are not completely free of resistance in the event of (short circuit) fault.

The input voltage, the output voltage, and the voltage over the resistor are determined, e.g., by means of a voltage divider (measuring bridge) connected in parallel, whose tapped voltages are recorded by means of a measuring device, preferably by means of an A/D converter, the measuring device being connected in terms of information technology to the analysis unit. Advantageously, the measuring device also has a calibration function which enables compensation for production-related and/or age-related and/or temperature-related deviations from nominal resistance values of the voltage dividers, so that highly accurate voltage measurements can be performed accordingly. It is furthermore conceivable to use different chip measurement methods.

In this way, the semiconductor switch assembly according to the invention enables a particularly reliable identification of faulty semiconductor switches, whereby the safety of a system using such a semiconductor switch assembly can, among other things, be increased. In the event of an short circuit identified by the analysis unit, it is possible to initiate a suitable fault treatment measure by the analysis unit, which comprises, e.g., a downstream closing of the respective non-faulty semiconductor switch and/or an additional electrical disconnection between the input terminal and the output terminal by means of a further disconnecting device. Alternatively or additionally, it is for fault handling also conceivable to reduce energy removal by a load connected to the output terminal and/or to place a superordinate system using the semiconductor switch assembly according to the invention into an emergency mode.

It should be noted that the triggering of the semiconductor switches and monitoring of the semiconductor switches need not necessarily be performed by the same component. Instead, it is also conceivable that the analysis unit comprises a first analysis unit and a second analysis unit, the first analysis unit being responsible for triggering the semiconductor switches, and the second analysis unit being responsible for monitoring the semiconductor switches.

The dependent claims disclose preferential embodiments of the invention.

In one advantageous embodiment of the present invention, the analysis unit is designed to trigger the first semiconductor switch and the second semiconductor switch such that a current flow between the input terminal and the output terminal is enabled bidirectionally or unidirectionally. A unidirectional current flow can be achieved by closing only one of the two semiconductor switches while leaving the other of the two semiconductor switches open so that a current flow in the forward direction of the inverse diode of the closed semiconductor switch is enabled. Depending on the triggering of the two semiconductor switches, a determination or a change of the current flow direction of the semiconductor switch assembly in the unidirectional mode is thus possible. Doing so is advantageously applicable when, e.g., using the semiconductor switch assembly according to the invention in connection with a battery, when only a discharging current is to flow from, but no charging current is to flow to, a battery connected to the input terminal.

In a further advantageous embodiment of the present invention, the analysis unit is designed to measure a current flowing between the input terminal and the output terminal and to verify compliance with respective target switching states for the first semiconductor switch and the second semiconductor switch on the basis of an expected connection between the measured current and a voltage between the input terminal and the output terminal. The expected current-voltage relationship is, e.g., determined from data sheets of the respective semiconductor switches and/or from measurements. A switching state in which both semiconductor switches are open or closed is considered a target switching state. Alternatively or additionally, the target switching state is a switching state in which one of the semiconductor switches is closed and the other semiconductor switch is open. The different current-voltage relationships resulting from these combinations can be compared with current measured values by the analysis unit in order to determine deviations from the target switching states.

It is furthermore possible for a series connection consisting of a third semiconductor switch and a fourth semiconductor switch to be arranged in parallel to the series connection comprising the first semiconductor switch and the second semiconductor switch, whereby the third semiconductor switch and the fourth semiconductor switch are connected according to the first semiconductor switch and the second semiconductor switch between the input terminal and the output terminal. The third semiconductor switch and the fourth semiconductor switch are preferably identical to the first semiconductor switch and the second semiconductor switch. In addition, a connection point of respective source terminals of the third semiconductor switch and the fourth semiconductor switch is connected to the connection point of the source terminals of the first semiconductor switch and the second semiconductor switch. The analysis unit is furthermore designed to perform short circuit monitoring and target switch state monitoring together for the first semiconductor switch, the second semiconductor switch, the third semiconductor switch, and the fourth semiconductor switch. Doing so provides, among other things, the advantage that no separate readback lines for each switch are to be provided compared to the use of conventional switches, whereby a simplified and possibly more cost-effective fault monitoring is enabled by means of the semiconductor switch assembly according to the invention. The parallel connection of two semiconductor switches arranged in an opposing manner as proposed herein offers the advantage that higher currents can be switched using the semiconductor switch assembly according to the invention than would be possible by using only two semiconductor switches connected in series. It is further conceivable to arrange further series connections of two semiconductor switches arranged in an opposing manner in parallel with the semiconductor switches specified hereinabove in order to be able to switch correspondingly higher currents. It should be noted that such a parallel connection of a plurality of semiconductor switches can also subsequently be considered a single logical switch and that the semiconductor switch assembly according to the invention can comprise a plurality of such logical switches.

In a further advantageous embodiment of the present invention, a current path including the first semiconductor switch and the second semiconductor switch is a first current path of the semiconductor switch assembly. The semiconductor switch assembly further comprises at least one second current path differing from the first current path between the input terminal and the output terminal and having a series connection consisting of a fifth semiconductor switch and a sixth semiconductor switch. Further, the resistor is a first resistor, and a second resistor is connected between the reference potential terminal and a connection point for the fifth semiconductor switch and the sixth semiconductor switch. The analysis unit is designed to perform short circuit monitoring and target switch state monitoring for the fifth semiconductor switch and the sixth semiconductor switch based on a voltage drop over the second resistor which is determined by the analysis unit independent of the voltage drop over the first resistor.

Particularly advantageously, the analysis unit is designed to take into account a first predefined tolerance range for the expected current-voltage relationship when determining compliance with the respective target switching states for the semiconductor switches being monitored, which applies when the semiconductor switches being monitored are triggered so as to enable a bidirectional current flow between the input terminal and the output terminal and to take into account a second predefined tolerance range for the expected current-voltage relationship, which applies if the semiconductor switches being monitored are triggered such that a unidirectional current flow between the input terminal and the output terminal is enabled. The first and second tolerance ranges are, e.g., determined by taking into account component tolerances, and/or temperature dependencies, and/or a number of series circuits of oppositely arranged semiconductor switches connected in parallel. In addition, it is possible to additionally determine the two tolerance ranges as a function of a maximum permitted number of faulty semiconductor switches, so that the tolerance ranges are still complied with even when, e.g., one or more of the semiconductor switches of the semiconductor switch assembly according to the invention have a fault.

In a further advantageous embodiment of the present invention, the analysis unit is designed to adjust the first tolerance range and the second tolerance range as a function of current paths and/or a number of parallel circuits used for semiconductor switches within a respective current path and/or a current-temperature relationship and/or aging conditions of respective semiconductor switches applicable to the respective semiconductor switches. It can this way be ensured that currently applicable boundary conditions are taken into account when monitoring the semiconductor switches, which in particular increases reliability of monitoring the semiconductor switches.

The analysis unit is preferably also designed to determine a type and/or an execution speed of a fault response, which is initiated in response to a determined fault state of at least one semiconductor switch, as a function of an amount of a deviation from the first tolerance range and/or the second tolerance range and/or a type of the present fault state (i.e., whether a short circuit and/or a deviation from a target switch state is present).

Further advantageously, the semiconductor switch assembly is designed to switch voltages of up to 60 V, preferably up to 400 V, and particularly preferably up to 1000 V.

Proposed according to a second aspect of the present invention is an energy system comprising a semiconductor switch assembly as described hereinabove, a first electrical energy source, in particular a first battery, which is connected between the input terminal and the reference potential terminal such that an electrical voltage is applied between the input terminal and the reference potential terminal and an electrical consumer and/or a switchable second electrical energy source, in particular a second battery which is connected between the output terminal and the reference potential terminal. Based on this configuration, the analysis unit of the semiconductor switch assembly is designed to determine a short circuit in the first semiconductor switch based on a voltage provided by the first electrical energy source. The analysis unit is furthermore designed to determine a short circuit in the second semiconductor switch after a disconnection of the electrical consumer from the first electrical energy source by the respective semiconductor switches, insofar as the electrical consumer is designed to store a consumed electrical energy at least for a predefined determination period (e.g., based on a capacitive portion in the electrical consumer), and/or to determine a short circuit during a state in which the respective semiconductor switches are open and the second electrical energy source is connected. The features, feature combinations, and the advantages resulting hereby correspond to those described in connection with the aspect of the invention specified in the introductory section clearly enough that reference is made to the descriptions hereinabove in order to avoid repetition.

Proposed according to a third aspect of the present invention is a vehicle having an energy system according to the description hereinabove, which is preferably an energy system of a powertrain of the vehicle. The vehicle is, e.g., an electrically driven car, an electrically driven truck, a hybrid vehicle, an electrically driven two-wheeler, or some other vehicle. The first electrical energy source is, e.g., a traction battery of the vehicle, while the electrical consumer is, e.g., a drive motor of the vehicle.

BRIEF DESCRIPTION OF THE DRAWINGS

Exemplary embodiments of the invention are described in detail hereinafter with reference to the accompanying drawings. Shown are.

DETAILED DESCRIPTION

Figure 1:
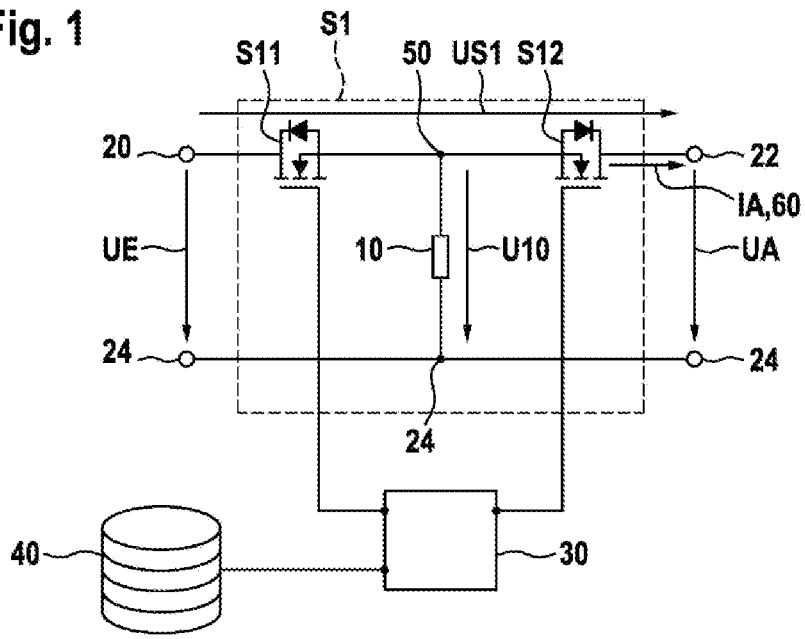
FIG. 1 a schematic of a semiconductor switch assembly according to the invention.

FIG. 1 shows a schematic of a semiconductor switch assembly according to the invention, wherein the semiconductor switch assembly comprises an input terminal 20, an output terminal 22, a ground terminal 24, a first MOSFET S11, a second MOSFET S12 (which are each of the "normal-open" type), a resistor 10, and an analysis unit 30, which is in this case designed as a microcontroller. The two MOSFETs S11, S12 form a logical switch S1 and are connected in series between the input terminal 20 and the output terminal 22 such that their respective source terminals are connected to each other at a connection point 50 and their respective inverse diodes are arranged anti-serially. By means of an electrical connection of the respective gate terminals of the two MOSFETs S11, S12 to the analysis unit 30, the analysis unit 30 is able to trigger the two MOSFETs S11, S12 independently so that a common opening or closing of the MOSFETs S11, S12, as well as a combination of a closed and an open MOSFET S11, S12 is enabled. Based on a measurement of an input voltage UE, a voltage US1 over the resistance 10, an output voltage UA and an output current IA flowing over a current path 60 of the semiconductor switch assembly, the analysis unit 30 is designed to determine both short circuits and deviations from target switching states in the MOSFETs S11, S12. For this purpose, current-voltage characteristics for the MOSFETs S11, S12 and information about a corresponding first tolerance range 70 and a corresponding second tolerance range 72 are additionally used by the analysis unit 30 in a storage unit 40 connected via information technology means to the analysis unit 30.

Figure 2:
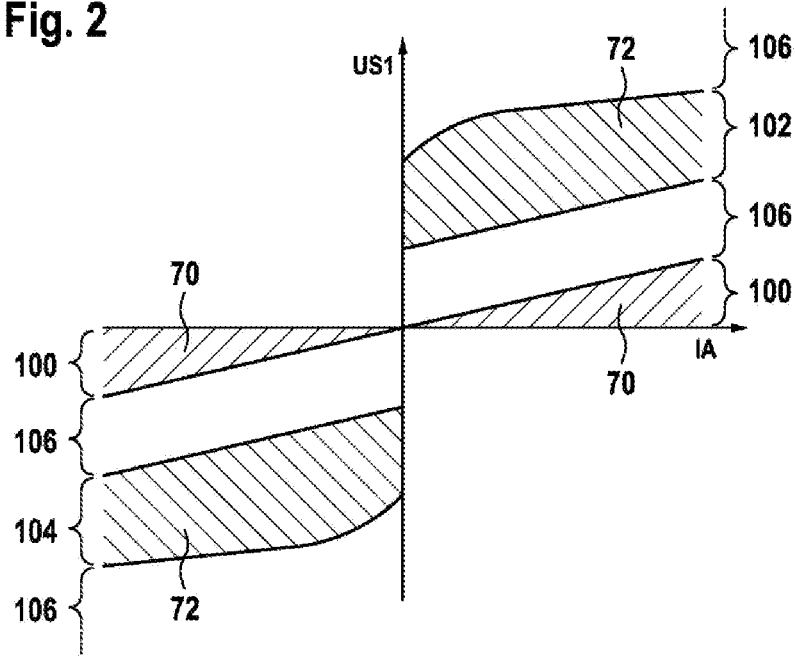
FIG. 2 an exemplary representation for a first tolerance range and a second tolerance range of a semiconductor switch assembly according to the invention.

FIG. 2 shows an exemplary description of a first tolerance range 70 and a second tolerance range 72, which are used by an analysis unit 30 according to the invention when monitoring semiconductor switches S11, S12 according to the invention. The two tolerance ranges 70, 72 are each defined by taking into account component tolerances and current-temperature dependencies of the semiconductor switches S11, S12. Depending on the direction of a current voltage drop over a switch S1 formed by semiconductor switches S11, S12 and/or respective switching states of the semiconductor switches S11, S12, the tolerance ranges 70, 72 of the first quadrant or third quadrant of the coordinate system shown in FIG. 2 are to be applied. The first tolerance range 70 is to be applied whenever both semiconductor switches S11, S12 are closed, which represents a first switching state 100 of the switch S1. The second tolerance range 72 shown in the first quadrant is to be applied in each case when the first semiconductor switch S11 is closed and the second semiconductor switch S12 is open, representing a second switching state 102 of the switch S1. The third tolerance range 72 shown in the first quadrant is to be applied whenever the first semiconductor switch S11 is open and the second semiconductor switch S12 is closed, representing a third switching state 104 of the switch S1. Each and every deviating range represents a fault state 106 of the switch S1.

Advantageously, an amount of a deviation from the tolerance ranges 70, 72 is additionally taken into account when determining a type and an execution speed of a fault response when a fault state is present.

Figure 3:
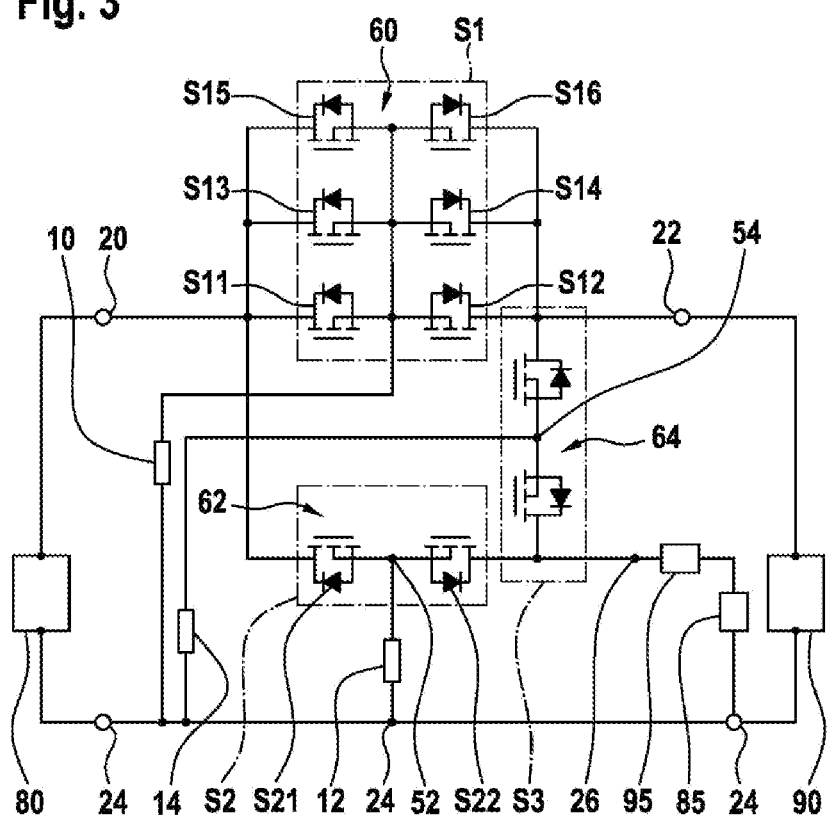
FIG. 3 a schematic of an energy system according to the invention.

FIG. 3 shows a circuit diagram of an energy system according to the invention, which shows an extension of the semiconductor switch assembly shown in FIG. 1. In order to avoid repetition, only the differences from FIG. 1 are explained hereinafter.

The semiconductor switch assembly of the energy system has a first switch S1, which is comprised here of three series connections arranged in parallel of semiconductor switches S11, S12, S13, S14, S15, S16, each arranged oppositely. In this way, it is possible to switch correspondingly high currents. The semiconductor switches S11, S13 and S15 are always triggered identically and the semiconductor switches S12, S14 and S16 are also always triggered identically. All of the current paths running through the first switch S1 in this case form a first current path 60.

The semiconductor switch assembly additionally comprises a second switch S2 which forms a second current path 62 and which comprises two semiconductor switches S21, S22 arranged in a manner similar to the semiconductor switches S11, S12 in the switch S1. The second switch S2 is connected between the input terminal 20 and a second output terminal 26 of the semiconductor switch assembly. In addition, a third switch S3, which is designed in a manner similar to the switch S2, is connected between the second output terminal 26 and the first output terminal 22 of the semiconductor switch assembly. A connection point of the semiconductor switches S21, S22 of the second switch S2 is connected to the ground terminal 24 via a second resistor 12, and a connection point of the semiconductor switches of the third switch S3 is connected to the ground terminal 24 via a third resistor 14. In this way, it is possible to measure the respective voltages over the first resistor 10, the second resistor 12, and the third resistor 14 independently and to determine potential fault states in the first switch S1, in the second switch S2, and in the third switch S3 independently, based on the respective measured voltages.

It should be noted that it is alternatively also possible to connect all or a part of the connection points of the respective semiconductor switches of the switches S1, S2 and S3 with high resistance at a "star point" via suitable resistors and to connect the star point to the ground terminal 24 via the first resistor 10. The second resistor 12 and the third resistor 14 can in this case be omitted. Such an alternative configuration enables joint monitoring of all involved semiconductor switches by evaluating the voltage drop over the first resistor 10.

The energy system comprises a first battery 80 that provides a voltage of 48 V and is connected between the input terminal 20 and the ground terminal 24 of the semiconductor switch assembly. The energy system further comprises an electrical consumer 90 having a capacitance and being connected between the first output terminal 22 and the ground terminal 24 of the semiconductor switch assembly. The energy system also comprises a second battery 85 which provides a voltage of 12 V and which is connected via a DC/DC converter between the second output terminal 26 and the ground terminal 24 of the semiconductor switch assembly.

By means of the switch S1, the energy system is designed to connect the first battery 80 to the electrical consumer 90 and electrically disconnect the two components from each other, e.g., in a fault state and/or quiescent state. By means of the switch S3, the energy system is designed to provide a pre-charge current limited via the DC/DC converter 95 for charging the capacity of the electrical consumer 90 by means of the second battery using the second battery when the switch S1 is open and when the switch S2 is open. By means of the switch S2, the energy system is designed to charge the second battery 85 via the first battery 80, or vice versa, with the switch S1 open and the switch S3 open.

Since all semiconductor switches of switches S1, S2 and S3 are connected to ground terminal 24 (in a manner similar to the description in FIG. 1) via a resistor 10, it is possible to perform a common short circuit monitoring for these semiconductor switches according to the description hereinabove. In addition, according to the description hereinabove, it is possible to verify respective target switching states of the semiconductor switches. Advantageously, adjusted first tolerance ranges 70 and second tolerance ranges 72 are used to verify the target switching states, depending on the respective active current paths 60, 62, 64.

It should be noted that the analysis unit 30 which performs the triggering, the short circuit monitoring, and the target switch state monitoring of the semiconductor switches are for the purpose of clarity not illustrated herein.

The invention claimed is:
1. A semiconductor switch assembly having a monitoring function and including:
a first semiconductor switch (S11),
a second semiconductor switch (S12),
a resistor (10),
an input terminal (20),
an output terminal (22),
a reference potential terminal (24), and
an analysis unit (30)
wherein
the first semiconductor switch (S11) and the second semiconductor switch (S12):
are connected in series between the input terminal (20) and the output terminal (22) such that a drain terminal of the first semiconductor switch (S11) is connected to the input terminal (20), a drain terminal of the second semiconductor switch (S12) is connected to the output terminal (22), and a source terminal of the first semiconductor switch (S11) is connected to a source terminal of the second semiconductor switch (S12) at a connection point (50) for the two semiconductor switches (S11, S12), and
are configured to allow and prevent a current to flow between the input terminal (20) and the output terminal (22) on the basis of a triggering operation by the analysis unit (30),
the resistor (10) is connected between the reference potential terminal (24) and the connection point (50) of the first semiconductor switch (S11) and the second semiconductor switch (S12), and
the analysis unit (30) is configured, in a state in which the first semiconductor switch (S11) and the second semiconductor switch (S12) are open:
to determine a short circuit in the first semiconductor switch (S11) when an output voltage (UA) between the output terminal (20) and the reference potential terminal (24) substantially corresponds to a voltage drop (U10) over the resistor (10), and
to determine a short circuit in the second semiconductor switch (S12) when an output voltage (UA) between the output terminal (22) and the reference potential terminal (24) substantially corresponds to a voltage drop (U10) over the resistor (10),
wherein the analysis unit (30) is configured to:
measure a current (IA) flowing between the input terminal (20) and the output terminal (22) and
verify compliance with respective target switching states for the first semiconductor switch (S11) and the second semiconductor switch (S12) on the basis of on an expected relationship between the measured current (IA) and a voltage (US1) between the input terminal (20) and the output terminal (22), and
wherein,
a series circuit comprising a third semiconductor switch (S13) and a fourth semiconductor switch (S14) arranged in parallel with the series circuit comprising the first semiconductor switch (S11) and the second semiconductor switch (S12), wherein the third semiconductor switch (S13) and the fourth semiconductor switch (S14) are, according to the first semiconductor switch (S11) and the second semiconductor switch (S12), connected between the input terminal (20) and the output terminal (22), a connection point of respective source terminals of the third semiconductor switch (S13) and the fourth semiconductor switch (S14) is connected to the connection point (50) of the source terminals of the first semiconductor switch (S11) and the second semiconductor switch (S12), and the analysis unit (30) is configured to perform a short circuit monitoring and target switching state monitoring together for the first semiconductor switch (S11), the second semiconductor switch (S12), the third semiconductor switch (S13), and the fourth semiconductor switch (S14).

2. The semiconductor switch assembly according to claim 1, wherein the analysis unit (30) is configured to trigger the first semiconductor switch (S11) and the second semiconductor switch (S12) such that a current flow between the input terminal (20) and the output terminal (22) is enabled bidirectionally or unidirectionally.

3. The semiconductor switch assembly according to claim 1, wherein
a current path including the first semiconductor switch (S11) and the second semiconductor switch (S12) is a first current path (60) of the semiconductor switch assembly,
the semiconductor switch assembly comprises at least one second current path (62) different from the first current path (60) between the input terminal (20) and the output terminal (22) having a series connection comprising a fifth semiconductor switch (S21) and a sixth semiconductor switch (S22),
the resistor is a first resistor (10),
a second resistor (12) is connected between the reference potential terminal (24) and a connection point of the fifth semiconductor switch (S21) and the sixth semiconductor switch (S22), and
the analysis unit (30) is configured to perform short circuit monitoring and target switch state monitoring for the fifth semiconductor switch (S21) and the sixth semiconductor switch (S22) based on a voltage drop over the second resistor (12).

4. The semiconductor switch assembly according to claim 1, wherein the analysis unit (30) is configured, when determining compliance with the respective target switching states for each of the semiconductor switches (S11, S12, S13, S14, S21, S22) being monitored:
to take into account a first predefined tolerance range (70) for the expected current-voltage relationship, which applies when the semiconductor switches (S11, S12, S13, S14, S21, S22) being monitored are triggered such that a bidirectional current flow between the input terminal (20) and the output terminal (22) is enabled, and
to take into account a second predefined tolerance range (72) for the expected current-voltage relationship, which applies when the semiconductor switches (S11, S12, S13, S14, S21, S22) being monitored are triggered such that a unidirectional current flow between the input terminal (20) and the output terminal (22) is enabled.

5. The semiconductor switch assembly according to claim 4, wherein the analysis unit (30) is configured to adapt the first tolerance range (70) and the second tolerance range (72) as a function of:
each of the current paths used (60, 62), and/or
a number of parallel circuits of semiconductor switches (S11, S12, S13, S14, S21, S22) used within a respective current path (60, 62), and/or
a current-temperature relationship applicable to the respective semiconductor switches (S11, S12, S13, S14, S21, S22), and/or
aging conditions of respective semiconductor switches (S11, S12, S13, S14, S21, S22).

6. The semiconductor switch assembly according to claim 1, wherein the analysis unit (30) is configured to determine a type and/or an execution speed of a fault response which is initiated in response to a determined fault state of at least one semiconductor switch (S11, S12, S13, S14, S21, S22) as a function of:
an amount of a deviation from the first tolerance range (70) and/or from the second tolerance range (72), and/or
a type of the fault state present.

7. The semiconductor switch assembly according to claim 1, wherein the semiconductor switch assembly is configured to switch voltages of up to 1000 V.

8. An energy system comprising:
a semiconductor switch assembly according to claim 1,
a first electrical energy source (80) connected between the input terminal (20) and the reference potential terminal (24) such that an electrical voltage (UE) is applied between the input terminal (20) and the reference potential terminal (24), and
an electrical consumer (90) and/or a switchable second electrical energy source (85) connected between the output terminal (22) and the reference potential terminal (24),
wherein
the analysis unit (30) is configured to:
determine a short circuit in the first semiconductor switch (S11) on the basis of a voltage (UE) provided by the first electrical energy source (80), and
determine a short circuit in the second semiconductor (S12) switch after a disconnection of the electrical consumer (90) from the first electrical energy source (80) by the respective semiconductor switches (S11, S12), insofar as the electrical consumer (90) is configured to store an absorbed electrical energy for at least a predefined determination period and/or during a state in which the respective semiconductor switches (S11, S12) are open and the second electrical energy source (85) is connected.

9. A vehicle comprising an energy system according to claim 8.

* * * * *